United States Patent [19]

Kampmann

[11] 4,239,937
[45] Dec. 16, 1980

[54] STEREO SEPARATION CONTROL

[76] Inventor: Frank S. Kampmann, 8 Belknap St., Arlington, Mass. 02174

[21] Appl. No.: 528

[22] Filed: Jan. 2, 1979

[51] Int. Cl.³ .............................................. H04S 1/00
[52] U.S. Cl. ........................... 179/1 G; 179/100.4 ST
[58] Field of Search ................ 179/1 G, 1 GQ, 1 GB, 179/100.4 ST, 1 GJ

[56] References Cited

U.S. PATENT DOCUMENTS

| 3,170,991 | 2/1965 | Glasgal | 179/1 G |
| 4,121,059 | 10/1978 | Nakabayashi | 179/1 G |
| 4,149,036 | 4/1979 | Okamoto et al. | 179/1 G |

OTHER PUBLICATIONS

"Stereo Width Control", Radio Electronics, Mar. 1973, p. 104.

Primary Examiner—Douglas W. Olms
Attorney, Agent, or Firm—Robert F. O'Connell

[57] ABSTRACT

Improved circuitry for providing stereo separation control in audio playback systems wherein undesirable volume level change and undesirable signal degradation due to noise, distortion and crosstalk are substantially reduced or eliminated by utilizing, in a preferred embodiment, a precision difference amplifier, a signal inverter, a tapped separation control, and a crosstalk-cancelling resistor.

16 Claims, 6 Drawing Figures $$\frac{R_{12}}{R_{11}} = \frac{R_{14}}{R_{13}} = \text{DIFFERENCE AMPLIFIER GAIN}$$

STEREO SEPARATION CONTROL

INTRODUCTION

This invention relates to circuitry for use in stereophonic transmission systems and, more particularly, to circuitry capable of providing stereo image width or separation control for improving the playback qualities of audio sound.

Stereophonic sound reproduction utilizes two simultaneous audio signals, normally a left signal and a right signal, which when converted into sound, provide a stereophonic effect, enabling a listener to localize in one dimension the apparent source of sound. In order for this system to provide accurate localization in which the perceived location matches the actual location of the original sound source, and the recorded stereophonic depth perspective is accurately reproduced, the overall system must be carefully matched. Microphones and their placement, recording and mixing equipment, transmission media, playback apparatus, and particularly loudspeakers and their interactions with the listening room environment all may affect the stereophonic effect. Undesired crosstalk from channel to channel, occurring in the electronic and mechanical parts of the system, also affect the stereophonic effect.

Given the multiplicity of recording techniques, loudspeakers and loudspeaker-listening room configurations, some form of compensation for the resulting errors in the stereo perspective is required for accurate imaging. Among the errors caused by this non-standardization is the error in apparent stereo image width or separation, that is, the area from which the sound appears to originate upon reproduction. Circuits have been designed to correct the apparent sound field, but these circuits have the disadvantage of introducing additional noise, distortion and crosstalk into the stereo signal, even when the circuits are in the normal or by-passed mode of operation (i.e. no correction). Furthermore, some of these circuits affect playback volume as well as separation, making them inconvenient to use. Economically, these circuits have the disadvantage of requiring either a multiplicity of adjustments and/or precision components in manufacture and as a result have found little commercial use. Nonetheless, it is desirable to provide a means for compensation of the apparent stereo image while avoiding the inconvenience of volume level changes and the undesirable degradation of the audio signal in an economical circuit.

The prior art has determined that the addition of various amounts of in-phase channel-to-channel crosstalk into a stereo signal reduces the apparent width of the stereo image, and that the introduction of out-of-phase crosstalk has the opposite effect, that is, the apparent image width is increased. In a preferred embodiment, a stereo separation control would offer continuous control from zero image width, through normal stereo reproduction, to maximum width-increase. A continuous width decrease from normal to zero is provided by mixing into each stereo channel an amount of in-phase opposite channel signal which varies from zero to equal gain. As the crosstalk approaches 100%, the image width shrinks to zero. A continuous width increase is provided by mixing into each channel a varying amount of out-of-phase signal from the opposite channel. Although there is a psychoacoustic limit to the widening of the stereophonic image, it is useful to provide a control range that includes the equal gain difference signal in order to provide a center channel nulling function which may be used for system tests. This is the function which the circuitry of the invention provides.

Circuitry which provides a control action similar to that of the invention was granted U.S. Pat. No. 3,170,991, System for Stereo Separation Ratio Control, Elimination of Crosstalk, and the Like, to Ralph Glasgal on Feb. 23, 1965. This circuitry has several disadvantages, including an interaction between perceived volume and separation as the control is rotated, high component count (particularly amplifying stages with their corresponding increased levels of noise and distortion), and requisite tighter component tolerances for a degree of accuracy equivalent to that of the invention, and the utilization of an extra stage of amplification in the signal paths at all times.

BRIEF SUMMARY OF THE INVENTION

This invention is based on the recognition that undesirable audio effects of prior art must be reduced or eliminated in order to make such circuitry suitable for high-quality audio playback systems in which noise, distortion and crosstalk must be minimized, while providing for precise control of the apparent stereo image width. Such operation is accomplished by use of circuitry which precisely generates the three most critical stereo width-determining signals to force the output signals to correspond closely to the desired combination of the input signals while providing cancellation of circuit-added noise, distortion and crosstalk.

DESCRIPTION OF THE INVENTION

The invention can be described in more detail with the help of the accompanying drawings wherein FIG. 1 shows the most advanced example of the prior art;

Figure 1:
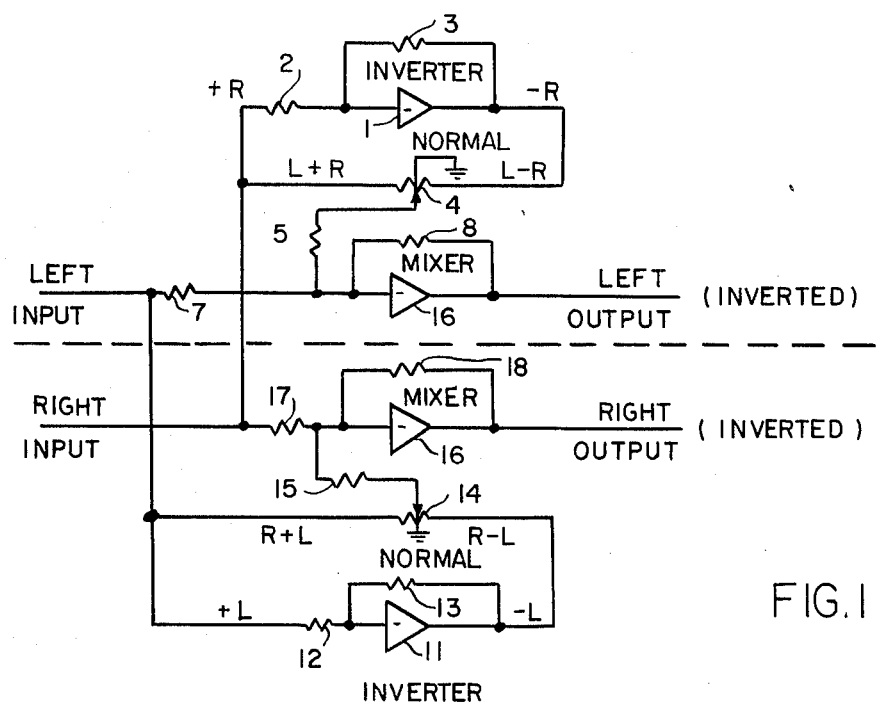

FIG. 1 shows the most advanced of the circuits for providing variable stereo separation used by the prior art, and is covered by U.S. Pat. No. 3,170,991. It consists of two identical circuits, one each for the left and right channels. Separation potentiometers 4 and 14 are usually ganged to allow for symmetrical adjustment of the sound field. Each circuit consists of a unity gain inverter, comprised of inverting amplifier 1 and identical resistors 2 and 3. The right input signal is applied to the "L+R" side of the separation control potentiometer 4, the inverted right input signal (−R) is applied to the "L−R" terminal, and the center tap is connected to ground. The potentiometer 4 wiper is connected by resistor 5 to the input of inverting amplifier 6, to which the left input signal is connected by resistor 7. With the separation potentiometer 4 set in the center of rotation, the control wiper is at ground potential, as determined both by the center tap and by the subtraction effect of two equal out-of-phase signals summed to zero by the equal resistances corresponding to each side of potentiometer 4. The center tap assures that residual distortion and noise generated by inverting amplifier 1 is nullified. Since the center of rotation of the control corresponds to a desired non-correction of the input signals, this elimination of a superfluous source of noise and distortion is desirable. With the control output zero, no signal is applied to mixing resistor 5, and the only signal amplified by inverting amplifier 6 is from the left input applied through resistor 7. Consequently, the left output signal is the left input signal inverted. With the separation control moved to the "L+R" position, the positive right input signal is applied to mixing resistor 5, and the left output is the inverted sum of the left and right input signals. Similarly, this output is also nominally produced by the right channel circuit. To the extent that both channels' outputs are identically left plus right, the resulting stereo image is collapsed to a point source, and the perceived image width is zero. The instantaneous summation of left and right input signals corresponds to what is generally accepted as monophonic mixing of a stereophonic signal. Although research indicates that a simple left plus right summation is not the most realistic monophonic representation of a stereophonic signal, because the resultant aural perspective is radically different from the original stereophonic signal, it is precisely that perspective-altering property that is of use in a separation compensation circuit. When the control is between the "normal" and "L+R" positions, the potentiometers 4 and 14 nominally interpolate between normal stereo and "L+R" to provide an apparent width change from the reference stereo width to zero. However, the playback volume is increased by the addition of the right signal to the constant left signal, and vice versa.

As the control is rotated to the "L−R, R−L" position, the potentiometer 4 wiper is connected to the inverted right input signal. This signal is applied via mixing resistor 5 to the mixing amplifier 6, where it is mixed with the left input signal, via resistor 7. Thus the output of amplifier 6 is nominally the inverted difference of the left and right input signals. Inversely, the nominal output of the right channel mixer amplifier 16 is the inverted difference of the right and left input signals, which is equal to but out-of-phase from the output of the left channel amplifier 6. At control rotations between center and "L−R, R−L," the potentiometers 4 and 14 once again interpolate to provide an apparent stereo image increasing in size.

While such circuitry, if carefully constructed and adjusted, is capable of providing the necessary degree and types of stereo image width correction, its complexity and principle indicate several performance and economic disadvantages. The accuracy of the summations of the left and right signals is determined by the degree of matching of the various resistors to each other as well as to the control potentiometers. The overall channel balance is determined by the relative ratios of mixing amplifier resistors 7, 8, 17 and 18 in each channel, and they must be matched for precise channel balance. The accuracy of the left plus right summation depends as well upon the ratios of resistors 5 and 7, so they must be matched in each channel, because small errors in the two summation processes yield non-identical outputs, and are perceived by the listener as a non-zero image width. The accuracy of the left minus right difference outputs is determined by the matching of resistors 2 and 3 as well as resistors 5 and 7. Because of the large so-called "center channel" content of many program sources, listening tests show that listeners are sensitive to small variations in the left minus right difference signal, which result in incomplete cancellation or nulling of the center channel.

Listening tests also demonstrate the audibility of signal polarity. In order for the present circuitry to be usable, a phase inverter stage must be added to each channel, thereby increasing the complexity of the system as a whole. A further disadvantage of the present circuit is the large number of components, especially inverting amplifiers, employed even under the condition of no correction: in the center or normal control position, the signal is processed by inverting amplifiers 6 and 16, with the resulting additional gratuitous attendant noise and distortion.

While the performance of the circuitry of FIG. 1 can be improved by the utilization of precision components and low noise and distortion amplifiers, such an arrangement is not economically practical for inclusion in other than specialized and expensive audio control apparatus. Furthermore, the method of simply mixing into one channel various amounts of crosstalk causes a change in the sound volume level, making an adjustment of the system volume control mandatory with each adjustment of the separation control. It is more desirable to achieve an elimination of the stringent component requirements and volume level interaction by use of circuitry which is not as sensitive as that of the prior art to component tolerances, noise and distortion, and which automatically compensates to provide constant volume output.

Figure 2:
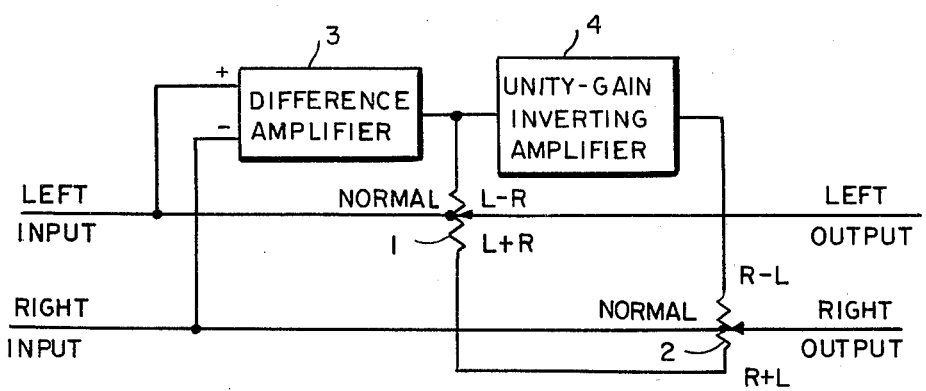
FIG. 2 shows a schematic diagram of one embodiment of the invention.

One technique for achieving such result in accordance with the invention is shown in FIG. 2 wherein the left and right input signals are applied directly to the center taps of ganged potentiometers 1 and 2, and the output signals are derived directly from the potentiometer wipers respectively.

The circuit of FIG. 2 derives the instantaneous sum of the left and right input signals from the resistances between the center taps and "L+R" terminals of potentiometers 1 and 2, which serve as voltage dividers to generate one-half the instantaneous sum of the left and right channel input signals. The factor of one-half insures that the overall loudness of the output signals is unchanged with rotation of the control potentiometers 1 and 2 from "normal" to "L+R" (zero width). For positions $0 \leq K \leq 1$ of the width control from "normal" (K=0) to "L+R" (K=1), the outputs are determined by the equations:

$$L_{out} = L_{in}(1 - \frac{K}{2}) + R_{in}(\frac{K}{2}) \text{ and}$$

$$R_{out} = R_{in}(1 - \frac{K}{2}) + L_{in}(\frac{K}{2}).$$

Since the overall playback volume level is substantially given by the instantaneous sum of the left and right channels and since the signal output of the circuitry of FIG. 2 sums to $L_{in}+R_{in}$ for all positions of the width control between "normal" and "zero width", the volume remains substantially constant. Also, the "L+R" (and "R+L") terminals of potentiometers 1 and 2 are connected together, insuring that the output signals are precisely identical with the potentiometer in the zero width position, irrespective of component tolerances.

While the primary requirement for the instantaneous sum is that both output channels carry precisely identical signals, the accuracy of the summation is not as critical. Nonetheless, the circuitry of FIG. 2 provides for high sum accuracy given by the ratio of the resistances of ganged potentiometers 1 and 2, and is independent of the absolute values of the potentiometer sections, and requires only a relatively economical match of potentiometer sections 1 to 2 rather than to an absolute value tolerance.

The requirements for the instantaneous difference signal are the inverse of those for the sum: the output signals need not be as well matched, but the subtraction process must be precise (in order to null so-called "center channel" information, that is, identical signals on the left and right channel inputs), and the center channel null must occur in each output signal precisely at the same point of rotation of the separation control (preferably at the extreme end of rotation). These requirements are satisfied by the circuitry of FIG. 2, in which the difference signals are derived by a precision difference amplifier 3 and inverted by a unity-gain inverting amplifier 4. As shown in FIG. 2, the positive input of difference amplifier 3 is connected to the left channel input, and the negative input is connected to the right channel input, with the output of the amplifier 3 connected to the "L−R" terminal of left channel potentiometer 1 and inverting amplifier 4, with the output of amplifier 4 connected to the "R−L" terminal of right channel potentiometer 2, but these channels may be reversed with no effect on circuit operation.

The gain of the difference amplifier 3 may be set to any value, yielding for amplifier 3 of FIG. 2 an output signal given by $(L_{in}-R_{in})/n$, where $1/n$ is the gain of the amplifier 3. While, in the case of the instantaneous sum, a preferred value for the "zero width" instantaneous sum gain factor of one-half is determined by a desire to maintain approximately constant overall system playback volume, the volume in the "expanded width" positions of the separation control will vary depending upon the relative positions of sound sources in the original stereo signal. While the overall volume level in this mode is program source dependent, and no absolutely accurate specification may be derived, it is expedient to specify the instantaneous difference gain factor to be the same as that for the instantaneous sum, namely, one-half. While the left and right channel inputs are assumed to be connected to voltage sources (zero output impedances), in practical applications these sources have small but not necessarily insignificant output impedances, and it is therefore important to insure that no undesirable channel-to-channel crosstalk is introduced. This is accomplished in the circuitry of FIG. 2 by setting the difference amplifier 3 gain equal to one-half. In this manner, the positive right channel signal current flowing into the "L+R" terminal of potentiometer 1 is cancelled by the negative right channel signal current flowing into the "L−R" terminal. A similar analysis applies to the left channel signal currents flowing into right channel potentiometer 2, and no opposite signal current flows out the center taps of either potentiometer 1 or 2, and crosstalk is thereby cancelled.

Figure 3:
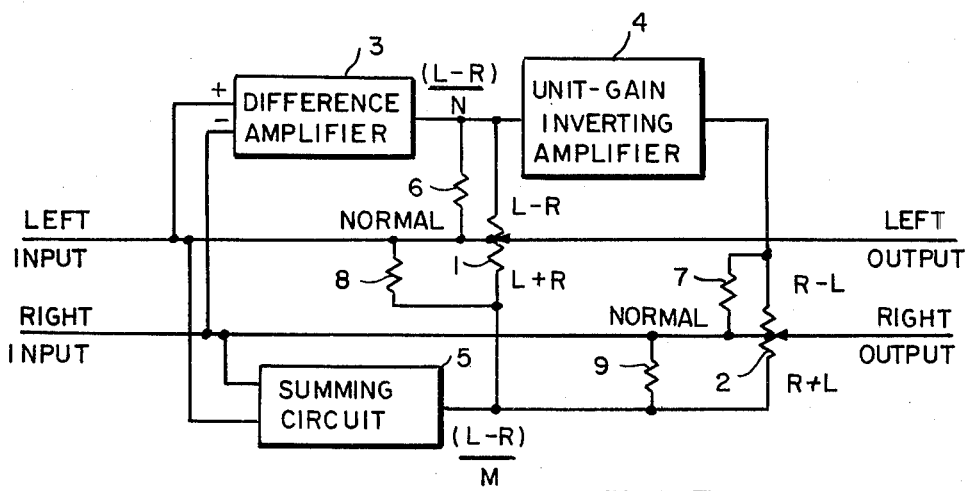
FIG. 3 shows modifications to the embodiment of FIG. 2 incorporating a number of options.
Figure 4:
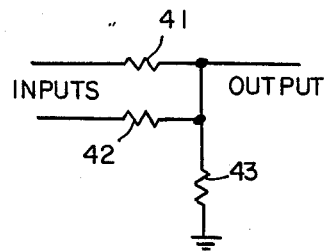
FIG. 4 shows an exemplary simple summing circuit for the circuitry of FIG. 3.
Figure 5:
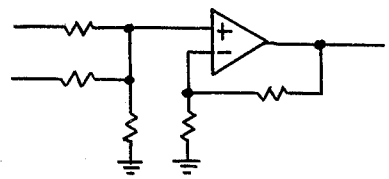
FIG. 5 shows a more sophisticated exemplary summing circuit for the circuitry of FIG. 3.

The circuitry of FIG. 2 may be modified to provide different factors for the instantaneous sum and difference signals, or for a more precise sum signal, if desired. Since potentiometer matching cannot be specified economically to tolerances closer than a few percent, applications requiring greater precision may find it expedient to add a separate summing circuit as shown in FIG. 3. This circuit may be as simple as two precision resistors 41 and 42 as shown in FIG. 4 of value sufficiently small to swamp the resistance variations of potentiometers 1 and 2. The opposite-channel crosstalk current may be cancelled by addition of two resistors 6 and 7 in FIG. 3 which inject out-of-phase opposite-channel signal currents into the input circuits to cancel the in-phase crosstalk caused by summing circuit 5. Likewise, a sum factor of other than one-half may be generated by use of a summing amplifier as exemplarily shown in FIG. 5 for any factor including one-half, or an additional attenuating resistor 43 as shown in FIG. 4 for any factor less than one-half. For sum factors less than one-half, resistors 8 and 9 may be required to cancel opposite-channel crosstalk current.

Whether or not an external summing circuit 5 is used, it may be desirable to provide for an instantaneous difference gain factor other than the one-half employed by the circuit of FIG. 2, and this may be done in the circuit of FIG. 3 by changing the difference amplifier gain and adding crosstalk-cancelling resistors 8 and 9 for factors greater than one-half, or resistors 6 and 7 for factors less than one-half. Similarly, combinations of the above options of the the circuitry of FIG. 3, 4 and 5 may be employed, with exact crosstalk cancellation provided by no more than two of the four resistors 6, 7, 8 or 9.

Figure 6:
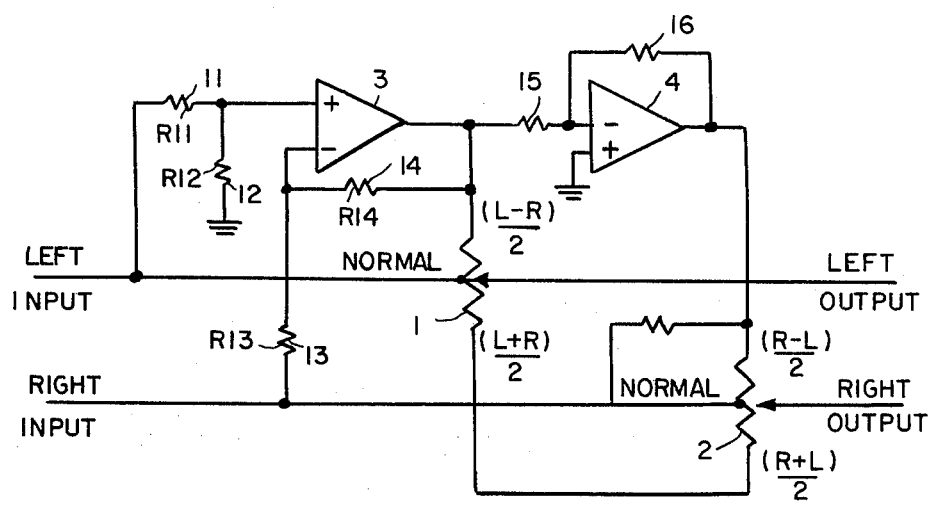
FIG. 6 shows a detailed schematic for one embodiment of FIG. 3.

FIG. 6 shows a practical implementation of the circuit of FIG. 2, with the difference amplifier 3 of FIG. 2 consisting in FIG. 6 of operational amplifier 3 and resistors 11, 12, 13 and 14, with values corresponding to the relationship $R_{12}/R_{11}=R_{14}/R_{13}=$difference gain factor, in this example equal to one-half. The unity-gain inverter 4 of FIG. 2 is implemented in FIG. 6 by operational amplifier 4 and equal-value resistors 15 and 16. Although the sum and difference factors are set to be identically one-half in this example, a crosstalk-cancelling resistor 7 is still required to eliminate crosstalk from the left channel into the right channel caused by asymmetry in the difference amplifier circuitry injecting positive left channel input signal into the right channel input via resistor 13.

The advantages of the circuitry of FIGS. 2, 3 and 6 over the prior art include: substantially no degradation of the audio signal due to the described circuitry while operating in the "normal" (no correction) mode due to the direct metallic connection of the outputs to the inputs via the wipers and center taps on potentiometers 1 and 2 in FIGS. 2, 3 and 6; cancellation of crosstalk-producing opposite signal currents by appropriate choice of sum and difference gain factors and/or crosstalk cancelling resistors 6, 7, 8 and 9; precisely identical left and right channel outputs in the "zero width" position, due to the direct metallic connection of the "L+R" terminals of potentiometers 1 and 2, with the accuracy of the sum dependent only on potentiometer matching, and not absolute tolerance; non-inverting configuration requiring no following inverting stages for phase correction; ability to provide arbitrary sum and difference factors independently (in particular, the optimal sum factor of one-half); and the ability to provide a continuous range of adjustment at constant volume level from zero width (sum signal) through normal stereo separation (no correction) to complete, precise cancellation of the center channel signal, with substantially reduced component and amplifier requirements.

The above description discloses new and improved circuitry for providing stereo image width control in audio playback systems which has advantages over those previously known. It should be appreciated that the modifications to the preferred embodiments described herein may occur to those in the art within the spirit and scope of the teachings herein. Accordingly, the invention is not to be limited to the specific embodiments described above, except as defined by the appended claims.

What is claimed is:

1. Circuitry for use over the audio frequency range and responsive to first and second stereo audio input signals, $L_{in}$ and $R_{in}$, for producing at least one of first and second audio output signals, $L_{out}$ and $R_{out}$, said circuitry comprising stereo signal mixing circuitry including a first variable control means having a parameter, K, capable of varying over a range $-1 \leq K \leq +1$ second variable control means having a parameter, K', capable of varying over a range $-1 \leq K' \leq +1$; said first variable control means being responsive to said first and second input signals for selectively controlling the proportions of said first input signal and said second input signal to produce said first output signal such that the relationship between said first and second input signals and said first output signal is proportional to $(L_{in})(1-K)+(K)(L_{in}+R_{in})/(M)$ for $0 \leq K \leq +1$, and to $(L_{in})(1+K)-(K)(L_{in}-R_{in})/(N)$ for $-1 \leq K \leq 0$; said second variable control means being responsive to said first and second input signals for selectively controlling the proportions of said second input signal and said first input signal such that the relationship between said first and second input signals and said second output signal is proportional to $(R_{in})(1-K')+(K')(L_{in}+R_{in})/(M)$ for $0 \leq K' \leq +1$, and to $(R_{in})(1+K)-(K')(R_{in}-L_{in})/(N)$ for $-1 \leq K' \leq 0$, where 1/M is an instantaneous sum factor the value of which is adjustable and 1/N is an instantaneous difference factor the value of which is adjustable.

2. Circuitry in accordance with claim 1 and further wherein each of said first and second variable control means includes means responsive to the settings of the parameters K and K', respectively, for preventing signal degradation due to circuitry-added noise and distortion when the parameters K and K' are equal to zero.

3. Circuitry in accordance with claims 1 or 2 wherein the values of 1/M and 1/N are positive.

4. Circuitry in accordance with claim 3 wherein the values of 1/M and 1/N are equal.

5. Circuitry in accordance with claim 4 wherein the values of 1/M and 1/N are each equal to ½.

6. Circuitry in accordance with claim 2 wherein said first and second variable control means each include a variable potentiometer and each of said parameters is an effective percentage of rotation of said variable potentiometer.

7. Circuitry in accordance with claims 1 or 6 wherein said mixing circuitry includes difference amplifier means and inverting amplifier means.

8. Circuitry in accordance with claim 6 wherein said signal degradation preventing means is the center tap on each of said variable potentiometers.

9. Circuitry in accordance with claim 8 wherein the center tap on each of said potentiometers is connected to a respective one of said input signals and the wipers of each of said potentiometers provide a corresponding respective one of said output signals.

10. Circuitry in accordance with claim 9 wherein the terminals of each of said variable potentiometers corresponding to the positions of the wipers of each of said variable potentiometers which provide the value of the respective parameters of said variable control means equal to +1 are electrically connected together, and the terminals of each of said variable potentiometers corresponding to the positions of the wipers of each of said variable potentiometers which provide the value of the respective parameters of said variable control means equal to −1 are connected to either said difference amplifier means or said inverting amplifier means, said difference amplifier means being further connected to said first and second input signals and said inverting amplifier means being further connected to the output of said difference amplifier means.

11. Circuitry in accordance with claim 6 and wherein said mixing circuitry further includes summing means comprising a resistor summing network means.

12. Circuitry in accordance with claim 11 wherein said summing means includes amplifier means connected to said resistor summing network means.

13. Circuitry in accordance with claim 1 and further including second means connected to each of said variable control means for preventing signal degradation due to circuitry-added crosstalk.

14. Circuitry in accordance with claim 13 wherein said second preventing means includes resistance means.

15. Circuitry in accordance with claim 1 wherein said first and second variable control means each includes a variable potentiometer and each of said parameters is an effective percentage of rotation of said variable potentiometer.

16. Circuitry in accordance with claim 3 and further including second means connected to each of said variable control means for preventing signal degradation due to circuitry-added crosstalk.

* * * * *